US005213919A

United States Patent [19]

Kuwakubo et al.

[11] Patent Number: 5,213,919

[45] Date of Patent: May 25, 1993

[54] PROCESS FOR PREPARATION OF LITHOGRAPHIC PRINTING PLATE AND ELUTING SOLUTION USED FOR SAID PROCESS CONTAINING ALKALI CHELATING AGENT

[75] Inventors: Seiji Kuwakubo, Fussa; Akio Akao; Takao Soma, both of Sagamihara; Takeo Kadoi, Nishitama, all of Japan

[73] Assignee: Iwatsu Electric Co., Ltd., Tokyo, Japan

[21] Appl. No.: 609,196

[22] Filed: Nov. 5, 1990

[30] Foreign Application Priority Data

Nov. 13, 1989 [JP] Japan ................................. 1-292229

[51] Int. Cl.[5] ........................ G03G 13/28; G03F 7/00

[52] U.S. Cl. ...................................... 430/49; 430/300; 430/309

[58] Field of Search .......................... 430/49, 300, 309

[56] References Cited

U.S. PATENT DOCUMENTS 3,236,640 2/1966 Tomanek et al. .................... 430/49
4,702,998 10/1987 Tanaka et al. ...................... 430/430
4,977,049 11/1990 Kato .................................... 430/49

FOREIGN PATENT DOCUMENTS 56-146145 11/1981 Japan ...................................... 13/26
60-194467 10/1985 Japan ...................................... 13/28
60-235144 11/1985 Japan ....................................... 5/06
63-309964 12/1988 Japan ....................................... 5/06

OTHER PUBLICATIONS

Chemical Abstracts 106 (22): 186513e, Toda et al., *Method of Pattern Formation*, 1986.

*Primary Examiner*—Cynthia Hamilton
*Assistant Examiner*—Mark A. Chapman
*Attorney, Agent, or Firm*—Paul & Paul

[57] ABSTRACT

Disclosed is an eluting solution for eluting a non-image area of an electrophotographic printing plate having a toner image formed and fixed thereon by electrophotography, to expose a hydrophilic substrate or a substrate that can be rendered hydrophilic. This eluting solution is an aqueous solution containing at least an alkali chelating agent.

3 Claims, No Drawings

PROCESS FOR PREPARATION OF LITHOGRAPHIC PRINTING PLATE AND ELUTING SOLUTION USED FOR SAID PROCESS CONTAINING ALKALI CHELATING AGENT

BACKGROUND OF THE INVENTION (1) Field of the Invention

The present invention relates to an alkaline eluting solution for use when preparing a lithographic printing plate by forming a toner image by the electrophotography and eluting a non-image area by an alkaline solution, and a process for preparing a lithographic printing plate by using this alkaline eluting solution.

(2) Description of the Related Art

Among known conventional lithographic printing plate material, are a PS (presensitized plate) prepared by using a photosensitive resin and forming an image by a photochemical reaction or the like, a silver master formed by using a silver halide photosensitive material, and an electrophotographic master paper formed by using a photoconductive material such as zinc oxide.

A diazo type photodecomposable polymer, vinyl type photopolymerizable polymer or photocrosslinkable prepolymer comprising a photosensitive resin is used as a material of a lithographic printing plate, and the characteristics of the photosensitive resin are utilized. The printing plate formed by using the above polymer has an excellent printing resistance but a low sensitivity, and thus a block copy film and an ultraviolet ray curing apparatus must be used at the plate-forming step. Therefore, the printing plate material is unsatisfactory in that the plate-forming step is complicated and the manufacturing cost is high.

The lithographic printing plate material formed by the diffusion process using a silver halide has an excellent sensitivity and resolving power, but the plate material is expensive and has an unsatisfactory poor printing resistance.

It is known that the lithographic printing plate material formed by the electrophotography using a photoconductive material can be formed into a lithographic printing plate by forming an image on the surface of the plate material by reflected rays from an original. According to an example of this image-forming process using zinc oxide, a dispersed mixture of zinc oxide (pigment), a binder (resin) and a sensitizing dye is uniformly coated (to a thickness of 10 to 15 μm) on the surface of a substrate having a low electric resistance, such as a paper or metal laminate, or an aluminum plate, to thereby form an electrophotographic photosensitive plate. A toner image is formed on this plate by rays reflected from an original by the electrophotography, and the surface of the formed photosensitive plate is then subjected to an etching treatment (desensitizing treatment) to desensitize the non-image areas, and thus a printing plate that can be set to an offset printing machine is provided. Nevertheless, the application of this zinc oxide printing plate as a lithographic printing plate, for which a high resolving power and printing resistance are required, is restricted because the surface particles are coarse or the adhesion of the photosensitive layer to the support is poor. Moreover, the surface of the photosensitive plate is not sufficiently desensitized and the application range is narrowed when certain kinds of inks are used.

According to another example of the process for preparing a lithographic printing plate by the electrophotography, a dispersed mixture is formed from an organic photoconductive pigment and a binder (resin) and an image is formed by using this photosensitive material in the same manner as described above with respect to the zinc oxide photosensitive plate. An alkali-soluble resin is used as the binder (resin), and the photosensitive material is coated on the surface of a substrate subjected to a hydrophilic treatment or on the surface of an aluminum plate subjected to a hydrophilic treatment by sandblasting or alumitizing, to form a photosensitive plate. A toner image is formed by electrophotography using a thermosetting or thermoplastic toner for the liquid developer. The photosensitive layer in the non-image area is eluted by using an alkaline eluting solution, while leaving the toner image area, to expose the hydrophilically treated surface or the sandblasted or alumitized surface of the aluminum plate, and finally, a lithographic offset printing plate is obtained. The printing plate material prepared from the foregoing starting materials shows a high resolving power, due to the fine particles of the liquid toner, and a high printing resistance and a high resolving power due to the high water-resistance and high mechanical strength of the aluminum plate. As the alkaline eluting solution, there can be mentioned, for example, and alkaline eluting solution containing sodium silicate, sodium hydroxide or sodium carbonate as the main component, an alcoholic eluting solution comprising benzyl alcohol or propanol as the main component, and a mixture thereof. An appropriate eluting solution is selected according to the kind of the binder resin or toner. A positive type eluting solution for a PS plate, customarily used in this field, can be used as an example of the commercially available alkaline eluting solution. When toner images were formed by using organic photoconductive photosensitive materials prepared by the present inventors, and were eluted with these known eluting solutions, the quality of the plate images after the elution depended greatly on the immersion time and the change of the temperature of the eluting solution, and good images were difficult to obtained.

SUMMARY OF THE INVENTION

Therefore, a primary object of the present invention is to provide a solution for eluting a non-image area, which will effectively form an electrophotographic printing plate having a high resolving power and a high stability without a substantial dependency on the immersion time and the temperature of the eluting solution, without contamination even when the eluting solution is used repeatedly.

In the process for the preparing a lithographic printing plate, which comprises the step of forming a toner image and fixing the formed image, by electrophotography, and the step of eluting a non-image area to expose a hydrophilic substrate, or a substrate that can be rendered hydrophilic, the above-mentioned object of the present invention can be attained by using an aqueous solution containing at least an alkali chelating agent as the solution for the eluting treatment.

The eluting step preferably comprises a first step of dipping an electrophotographic printing plate in an eluting solution and second step of washing out the electrographic printing plate with water.

DESCRIPTION OF THE PREFERRED EMBODIMENTS

Any alkali exerting a chelating action can be used as the alkali chelating agent in the present invention, but aqueous solutions containing alkali chelating agents represented by the following general formulae:

$$(XOOCCH_2)_2NCH_2CH_2N(CH_2COOX)_2, \quad (a)$$

$$N(CH_2COOX)_3 \text{ and} \quad (b)$$

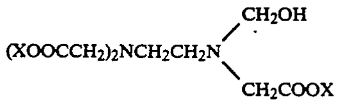
(c)

wherein X represents K, Na or $NH_4$, are most preferably used.

The alkali chelating agent represented by general formula (a), which is used in the present invention, is a tetra-alkali salt of ethylenediamine-tetra-acetic acid (hereinafter referred to as "EDTA-4-alkali salt"), and as specific examples there can be mentioned EDTA-$_4$K salt, EDTA-4Na salt, and EDTA-$_4$NH4 salt.

As specific examples of the tri-alkali salt of nitrilo-triacetic acid (hereinafter referred to as "NTA-3-alkali salt") represented by general formula (b), there can be mentioned NTA-3K salt, NTA-3Na salt, and NTA-3$NH_4$ salt.

As specific examples of the tri-alkali salt of hydroxyethylethylenediamine-triacetic acid (hereinafter referred to as "HEDTA-3-alkali salt") represented by general formula (c), there can be mentioned HEDTA-3K salt, HEDAT-3Na salt, and HEDATA-3$NH_4$ salt.

The characteristics of the resin to be used for the photosensitive layer are important to the obtaining of a good printing plate by eluting the non-image area by the aqueous solution of the above-mentioned alkali chelating agent while leaving the image area. For example, where electrophotographic characteristics, i.e., a large charge quantity and a high sensitivity, are required, if these characteristics are improved, the resin becomes insoluble in the alkaline solution. Accordingly, a strong alkaline solution is used, and thus a premature dissolution of the image occurs and the range of conditions for forming a good image at the eluting step is narrowed. Nevertheless, if the above-mentioned alkali chelating agent is used, the range of image-forming conditions is broadened and a good printing plate can be formed.

Specific examples of the chelating agents of the general formulae (a), (b), and (c), and the results of experiments conducted by using these chelating agents, will now be described. In general, an alkali chelating agent has properties such that the alkali chelating agent is bonded to various metal ions in an aqueous solution to form a water-soluble complex salt, and this complex salt has a property of being soluble in water. By utilizing this property for an eluting solution for eluting a non-image area of the photosensitive layer, the allowable ranges of the concentration of the eluting solution and the immersion time are broadened, and a good printing plate can be formed.

For example, the latitude of the temperature of the wash-out solution for obtaining a good image is within ±0.5° C. in the case of a commercially available wash-out solution for a PS plate (DP-4 supplied by Fuji Shashin Film), but this latitude is broadened to ±(3° to 4)° C. in the case of a wash-out solution containing the above-mentioned chelating agent.

The concentration of the alkali chelating agent in the eluting solution is not particularly critical, but is preferably 8 to 20% by weight. If the concentration of the alkali chelating agent is too low, the latitude of the eluting time is narrowed and the controllability of the elution is reduced, and if the concentration of the alkali chelating agent is too high, the time required for the elution is unnecessarily prolonged.

An alkali customarily used for the eluting treatment can be used in combination with the alkali chelating agent in the present invention. In the case of this combined use, the effect is lower than the effect attained by the single use of the alkali chelating agent, but is higher than the effect attained by the single use of the conventional alkali.

Alkali Chelating Agent Eluting Solution Example 1

As the tetra-alkali salt of ethylenediamine-tetraacetic acid of the following general formula (a):

$$(XOOCCH_2)_2NCH_2CH_2N(CH_2COOX)_2 \quad (a)$$

the Na salt, i.e., EDTA-4Na, having the following chemical structural formula (1):

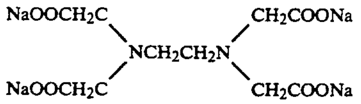
, (1)

is used, and preferably this salt is used in the form of an aqueous solution having a concentration of 10 to 17%, at a liquid temperature of 33° to 39° C. A plate having a toner image, described in the photosensitive layer composition example given hereinafter (Photosensitive Layer Composition Example 1 or 2), is immersed in the aqueous solution for 10 to 25 seconds. Then, after the immersion, the surface is rubbed with a brush or synthetic sponge while washing with city water (clear water), to expose the hydrophilically treated surface of the non-image area or expose the sandblasted or alumitized surface of the aluminum plate, whereby a good printing plate, on which the toner image area remains, is prepared.

Alkali Chelating Agent Eluting Solution Example 2

As the tri-alkali salt of nitrilo-triacetic acid of the following general formula (b):

$$N(CH_2COOX)_3 \quad (b)$$

the Na salt (hereinafter referred to as "NTA-3Na") having the following chemical structural formula (2):

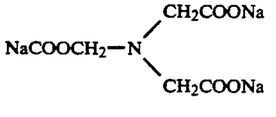
(2)

is used, and preferably the Na salt is used in the form of an aqueous solution having a concentration of 8 to 18% at a liquid temperature of 31° to 39° C. A plate having a toner image, described in the photosensitive layer composition example given hereinafter (photosensitive Layer Composition Example 1 or 3) is immersed in the alkali chelating agent solution for 10 to 25 seconds, preferably 22 seconds, and the treatment after the immersion is carried out in the same manner as described in Alkali Chelating Agent Eluting Solution Example 1. A good printing plate is obtained.

Alkali Chelating Agent Eluting Solution Example 3

As the tri-alkali salt of hydroxyethylethylenediamine-triacetic acid of the following general formula (c):

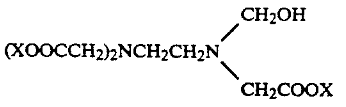

(c)

the Na salt (hereinafter referred to as "HEDTA-3Na") represented by the following chemical structural formula (3):

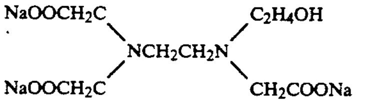

(3)

is used, and preferably the salt is used in the form of an aqueous solution having a concentration of 15 to 19% at a liquid temperature of 30° to 40° c. A plate having a toner image, described in the photosensitive layer composition example given hereinafter (Photosensitive Layer Composition Example 2 or 4) is immersed in the alkali chelating agent solution for 10 to 25 seconds, preferably 17 seconds. The treatment after the immersion treatment is carried out in the same manner as described in Alkali Chelate Agent Eluting Solution Example 1, and a good printing plate is prepared.

The electrophotographic printing plate to be used is prepared by coating a photosensitive material formed by dispersing an organic photoconductive pigment into an alkali-soluble binder on a substrate having a hydrophilically treated surface.

In connection with the photosensitive material, a perylene pigment, a perinone pigment, an anthanthrone pigment, a phthalocyanine pigment, and an azo pigment can be used as the charge-generating material. These pigments have a high sensitivity and good electrostatic characteristics. These photoconductive substances can be used singly or in the form of a mixture of two or more thereof, and if necessary, can be used in combination with other photoconductive substance.

The alkali-soluble binder (resin) has a carboxyl group acting as an acid in the resin, and a reaction with the alkalinity possessed by the alkali chelating agent is carried out in an alkaline solution having a relatively high concentration. Then, the resin is eluted by interposed water to expose the hydrophilic surface of the substrate. Since the so-formed plate is to be used as the printing plate, the plate must have a high resistance against peeling from the aluminum substrate, a high ink resistance, and a high mechanical strength, and resins having such properties are described below. Namely, as the acrylic resin, there can be mentioned copolymer resins of at least one member selected from acrylic acid esters such as methyl acrylate, ethyl acrylate and butyl acrylate with at least one member selected from polymerizable monomers having a carboxyl group, such as acrylic acid and methacrylic acid, and copolymer resins of at least one polymerizable monomer selected from methacrylic acid esters such as methyl methacrylate, ethyl methacrylate, butyl methacrylate, 2-ethylhexyl methacrylate, stearyl methacrylate and hydroxyethyl methacrylate with at least one monomer selected from polymerizable monomers having a carboxyl group, such as acrylic acid and methacrylic acid. As the vinyl ester resin, there can be mentioned homopolymers of vinyl acetate, vinyl butyrate and vinyl propionate, and copolymers of at least one of these monomers with an unsaturated carboxylic acid such as stearic acid, lauric acid, alkyl acid, butyl acid, octyl acid, crotonic acid, methyl acid or ethyl acid.

A toner image is formed on the so-prepared photosensitive plate by electrophotography, and when a thermoplastic or thermosetting resin is used for the toner, the toner image area is rendered oleophilic and alkali-insoluble. After the formation of the toner image, the non-image area is eluted by using the alkaline eluting solution to expose the hydrophilic surface of the substrate, whereby a printing plate is prepared.

The aqueous solution containing the alkali chelating agent is used as the solution for eluting the non-image area, and the elution is carried out under such conditions as a solution concentration of 8 to 20% by weight, a solution temperature of 30° to 40° C., and an immersion time of 10 to 25 seconds. The surface of the plate is rubber with a brush or synthetic sponge while washing with city water to expose the hydrophilic surface and prepare a printing plate. Printing can be carried out by using the thus-prepared printing plate with an oleophilic ink.

EXAMPLES

The present invention will now be described in detail with reference to the following examples.

Resin Example 1

A copolymer resin comprising methyl methacrylate (5 to 20 parts), butyl methacrylate (40 to 80 parts), acrylic acid (5 to 30 parts) and methacrylic acid (5 to 30 parts) is used. Preferably, the acid value of the copolymer resin is 180 to 250 and the weight average molecular weight is 15,000 to 100,000.

Resin Example 2

A copolymer resin comprising a vinyl acetate resin (50 to 80 parts) and crotonic acid (20 to 40 parts) is used. Preferably, the acid value of the copolymer resin is 40 to 100 and the weight average molecular weight is 5,000 to 20,000.

Examples of the photosensitive layer composition comprising the above-mentioned pigment and binder (resin) will now be described.

Photosensitive Layer Composition Example 1

A composition comprising 20 parts of a perylene pigment, 60 parts of a copolymer resin (comprising 10 parts of methyl methacrylate, 60 parts of n-butyl methacrylate, 15 parts of acrylic acid, 15 parts of methacrylic acid) having an acid value of 210 and a weight average molecular weight of 18,000, 7 parts of hydrazone represented by the following formula:

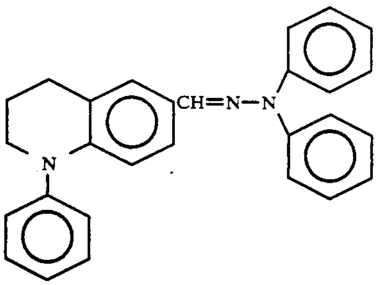

and 100 parts of a solvent were uniformly dispersed for 20 hours by using a ball mill and then diluted with methyl cellosolve. The composition was coated to a thickness of 5 μm on an aluminum plate (supplied by Nippon Seihaku) having a thickness of 100 μm, as described hereinbefore, by using a wire bar and the solvent was removed by drying, whereby a photosensitive plate was prepared.

The photosensitive plate was allowed to stand in the dark for 24 hours at normal temperature, and the then subjected to a printing plate-forming operation by an electronic plate-forming machine (Model IP-701 supplied by Iwasaki Tsushinki) by using a set VO-3 for IP-701 as the liquid developer, whereby a printing plate having a good image was obtained.

Photosensitive Layer Composition Example 2

A printing plate having a good image was prepared by forming a photosensitive layer and an image in the same manner as described in Photosensitive Layer Composition Example 1, using a composition comprising 20 parts of a perylene pigment, 60 parts of a copolymer resin (comprising 70 parts of vinyl acetate, 30 parts of crotonic acid) having an acid value of 70 and a weight average molecular weight of 8.000, 7 parts of hydrazone (same as in Photosensitive Layer Composition Example 1), and 100 parts of a solvent (methyl cellosolve).

Photosensitive Layer Composition Example 3

A printing plate having a good image was prepared by forming a photosensitive layer and an image in the same manner as described in Photosensitive Layer Composition Example 1, using a composition comprising 20 parts of a perylene pigment, 60 parts of the same resin as used in Photosensitive Layer Composition Example 1, 7 parts of hydrazone (same as in Photosensitive Layer Composition Example 1), and 100 parts of a solvent (methyl cellosolve).

Photosensitive Layer Composition Example 4

A printing plate having a good image was prepared by forming a photosensitive layer and an image in the same manner as described in Photosensitive Layer Composition Example 1 using a composition comprising 20 parts of a dibromoanthanthrone pigment, 60 parts of the same resin as used in Photosensitive Layer Composition Example 2, 7.5 parts of hydrazone (same as in Photosensitive Layer Composition Example 1), and 100 parts of a solvent (methyl cellosolve).

Alkali Chelating Agent Example 1

A 14% aqueous solution of EDTA-Na (Having a pH value of 10.91) was prepared from a composition comprising 14 parts of tetra-sodium ethylenediaminetetraacetate (EDTA-4Na) and 86 parts of water, and an alkaline eluting solution was formed by heating this aqueous solution at 36° C. in an enameled vat.

The printing plate having a toner image, as described in Photosensitive Layer Composition Example 1 or 3, was immersed in the obtained eluting solution for about 17 seconds, and after the immersion, the non-image area was eluted by a brush or synthetic sponge, while washing with city water, to expose the hydrophilic surface of the substrate or the sandblasted or alumitized surface of the aluminum plate, whereby a printing plate having no image unevenness was obtained. During the immersion, no contamination of the solution by the dissolution of the photosensitive layer or the peeling of the photosensitive layer occurred.

The printing test was carried out under the following conditions, using the obtained printing plate.

At the step of the preliminary treatment before the printing operation, the printing plate was rubbed by hand with an absorbent cotton impregnated with a 2% aqueous solution of sodium primary phosphate as the etching solution. A dilution having a pH value of 6.5, formed by diluting the etching solution at a ratio of 100, was used as the damping water. A Sinflo system (AB-DIC-350) and a Morton system (Hamada 800CD) were used as the printing machine, and more than 20,000 prints were formed by printing with Elefax Ink Black (N). The printing plate and obtained prints had no defects, and good prints were obtained.

Alkali Chelating Agent Example 2

A 13% aqueous solution having a pH value of 11.02 was prepared from a composition comprising 13 parts of tri-sodium nitrilo-triacetate (NTA-3Na) and 87 parts of water, and an alkaline eluting solution was prepared by heating the aqueous solution at 35° C. in an enameled vat.

The plate having a toner image, as described in Photosensitive Layer Composition Example 1 or 3, was immersed in the eluting solution for 22 seconds, and the non-image area was then eluted by using a brush or synthetic sponge, while washing with city water, to expose the hydrophilic surface of the substrate or the sandblasted or alumitized surface of the aluminum plate, whereby a good printing image having no image unevenness was prepared. No contamination of the eluting solution by the dissolution of the photosensitive layer or the peeling of the photosensitive layer occurred during the immersion.

Using the obtained printing plate, the printing test was carried out in the same manner as described in Alkali Chelating Agent Example 1. The printing plate and obtained prints had no defects, and good prints were obtained.

Alkali Chelating Agent Example 3

A 18% aqueous solution of HEDTA-3Na (having a pH value of 11.92) was prepared from a composition comprising 18 parts of tri-sodium hydroxyethylethylenediamine -triacetate and 82 parts of water, and an alkaline eluting solution was prepared by heating the aqueous solution at 37° C. in an enameled vat.

The printing plate having a toner image, as described in Photosensitive Layer Composition Example 2 or 4, was immersed in the eluting solution for 17 seconds, and after the immersion, the non-image area was eluted by a brush or synthetic sponge, while washing with city water, to expose the hydrophilic surface of the substrate or the sandblasted or alumitized surface of the aluminum plate, whereby a good printing plate having no image unevenness was obtained. No contamination of the eluting solution by the dissolution of the photosensitive layer or the peeling of the photosensitive layer occurred during the immersion.

Using the obtained printing plate, the printing test was carried out in the same manner as described in Alkali Chelating Agent Example 1. The printing plate and obtained prints had no defects, and good prints were obtained.

Comparative Example 1

Using the photosensitive plate obtained in Photosensitive Layer Composition Example 1, a toner image was formed in the same manner as described above, and the plate was immersed in a commercially available positive type alkaline eluting solution for an SP plate at a solution temperature of 30° C. for 10 to 11 seconds, and then washed with city water. Contamination of the solution occurred, and because of a high solubility of the image, the image formed on the printing plate was incomplete and uneven. Therefore, a printing plate having a high resolving power was not obtained.

Comparative Example 2

A toner image was formed by using the photosensitive layer prepared in Photosensitive Layer Composition Example 2, in the same manner as described above, and the plate was immersed in a 5% aqueous solution of sodium metasilicate at a solution temperature of 30° C. for a time of 12 to 13 seconds, taken out of the solution, and washed with city water. As in Comparative Example 1, a printing plate having a high resolving power was not obtained.

The results of the dissolution test and printability test, obtained in the foregoing examples, are shown in Table 1.

TABLE 1

| Alkali Chelating Agent Eluting Solution | Photosensitive Layer Composition Example No. | Immersion Time (seconds) | Contamination of Eluting Solution | Image Quality after Water Washing | Printability |
|---|---|---|---|---|---|
| Example 1, | 1 | 15 to 20 | not caused | good | good |
| EDTA-4Na | 3 | 15 to 20 | not caused | good | good |
| Example 2, | 1 | 20 to 25 | not caused | good | good |
| NTA-3Na | 3 | 20 to 25 | not caused | good | good |
| Example 3, | 2 | 15 to 20 | not caused | good | good |
| HEDTA-3Na | 4 | 15 to 20 | not caused | good | good |
| Comparative Example 1, commercially available positive solution for PS plate | 1 | 10 to 11 | conspicuous | poor | poor |
| Comparative Example 2, sodium metasilicate | 2 | 12 to 13 | conspicuous | poor | poor |

As apparent from the foregoing test results, the present invention provides an eluting solution capable of providing a stable printing plate having a high resolving power, in the process for forming a printing plate by eluting a non-image area in a plate having a toner image formed by electrophotography, and having an activity which is little influenced by the immersion time or the liquid temperature and which suffers little contamination even if the solution is repeatedly used, Further, it has been found that good results are similarly obtained when a color ink is used.

We claim:

1. An eluting solution for eluting a non-image area of an electrophotographic printing plate, which is used for a treatment of eluting a non-image area of a substrate having a toner image formed and fixed by electrophotography to expose a hydrophilic surface, or a surface that can be rendered hydrophilic, said eluting solution being an aqueous solution containing an alkali chelating agent selected from the group consisting of compounds of the general formula:

$(XOOCCH_2)_2CH_2CH_2N(CH_2COOX)_2$; a)

$N(CH_2COOX)_3$ and; b)

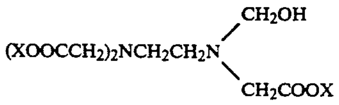 c)

wherein X is at least one member selected from the group consisting of K, Na and $NH_4$ and said eluting agent contains form about 8 to 20% by weight of the alkali chelating agent.

2. A process for preparation of a lithographic printing plate, which comprises the steps of forming a toner image area and a non-image area on an electrophotographic printing plate obtained by coating a dispersion of an organic photoconductive pigment in an alkali-soluble binder on a substrate having a hydrophilic surface or a surface that can be rendered hydrophilic, fixing the toner image area by electrophotography, and selectively eluting the non-image area of the electrophotographic printing plate with an eluting solution by first dipping the plate in said solution followed by washing out the electrophotographic plate with water to expose the substrate, wherein the eluting solution is an aqueous solution containing from about 8 to 20% by weight of an alkali chelating agent.

3. A process according to claim 2, wherein the alkali chelating agent is at least one member selected from the group consisting of compounds represented by the following general formulae (a), (b) and (c):

$(XOOCCH_2)_2NCH_2CH_2N(CH_2COOX)_2$, (a)

$N(CH_2COOX)_3$ and (b)

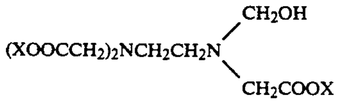 (c)

wherein X is at least one member selected from the group consisting of K, Na and $NH_4$.

* * * * *